United States Patent
Kwon et al.

(10) Patent No.: US 9,219,482 B2
(45) Date of Patent: Dec. 22, 2015

(54) HIGH VOLTAGE SWITCH CIRCUIT AND NONVOLATILE MEMORY INCLUDING THE SAME

(71) Applicant: SK hynix Inc., Gyeonggi-do (KR)

(72) Inventors: Tae-Heui Kwon, Gyeonggi-do (KR); Jin-Su Park, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 0 days.

(21) Appl. No.: 14/523,461

(22) Filed: Oct. 24, 2014

(65) Prior Publication Data

US 2015/0303922 A1 Oct. 22, 2015

(30) Foreign Application Priority Data

Apr. 17, 2014 (KR) .................. 10-2014-0046145

(51) Int. Cl.

| G11C 7/00 | (2006.01) |
|---|---|
| H03K 19/0185 | (2006.01) |
| G11C 11/56 | (2006.01) |
| G11C 16/30 | (2006.01) |
| G11C 8/08 | (2006.01) |
| G11C 5/14 | (2006.01) |

(52) U.S. Cl.
CPC .......... *H03K 19/018521* (2013.01); *G11C 8/08* (2013.01); *G11C 11/5621* (2013.01); *G11C 16/30* (2013.01); *G11C 5/145* (2013.01)

(58) Field of Classification Search
CPC .......... G11C 8/08; G11C 16/30; G11C 5/145; G11C 5/147; H03K 17/063; H03K 17/08142; H03K 17/693; H03K 2217/0054
USPC .......... 365/185.03, 185.23, 189.05, 365/189.11–189.12, 189.09; 327/333, 112
See application file for complete search history.

(56) References Cited

U.S. PATENT DOCUMENTS 5,257,031 A * 10/1993 Scarpetta ................. H01Q 3/26
342/374

FOREIGN PATENT DOCUMENTS

| KR | 1020120013083 | 2/2012 |
|---|---|---|
| KR | 1020120086481 | 8/2012 |

* cited by examiner

*Primary Examiner* — David Lam
(74) *Attorney, Agent, or Firm* — IP & T Group LLP

(57) ABSTRACT

A high voltage switch circuit includes a high voltage switch suitable for transferring a voltage of an input terminal to an output terminal in response to a voltage of a control node; a first transistor suitable for electrically connecting a first node and the control node in response to an inverted activation signal; a second transistor suitable for supplying a first high voltage to the first node in response to an activation signal; a third transistor connected in parallel to the second transistor, and operable in response to the control node; a discharge transistor suitable for discharging the control node; and a first level shifter suitable for changing a swing level of a preliminary activation signal, and generating the activation signal and the inverted activation signal.

15 Claims, 3 Drawing Sheets

HIGH VOLTAGE SWITCH CIRCUIT AND NONVOLATILE MEMORY INCLUDING THE SAME

CROSS-REFERENCE TO RELATED APPLICATIONS

The present application claims priority of Korean Patent Application No. 10-2014-0046145, filed on Apr. 17, 2014, which is incorporated herein by reference in its entirety.

BACKGROUND

1. Field

Various exemplary embodiments of the present invention relate to a high voltage switch circuit which is used to transfer a high voltage.

2. Description of the Related Art

Nonvolatile memories retain data even though their power supply is interrupted. Among such nonvolatile memories, a floating gate type nonvolatile memory, which is currently prevalent, utilizes a floating gate that is disposed over and insulated from the channel region of a substrate. In particular, the nonvolatile memory utilizes the threshold voltage of a memory cell that depends on the amount of charge retained in the conductive band of the floating gate.

A nonvolatile memory includes a memory cell array for storing data. The memory cell array has a plurality of memory blocks. Each memory block has a plurality of pages. Each page has a plurality of memory cells. The respective memory cells are classified into on-cells and off-cells according to their threshold voltage distributions. On-cells are erased cells, and off-cells are programmed cells. The nonvolatile memory performs an erase operation by the unit of a memory block, and performs a program or read operation by the unit of a page.

The nonvolatile memory may store 1 or more-bits of data in a single memory cell. A memory cell that stores 1-bit data is referred to as a single level cell (SLC), and a memory cell that stores 2 or more bits of data is referred to as a multi-level cell (MLC). The single level cell has an erased state and a programmed state that are determined by its threshold voltage. The multi-level cell has an erased state and a plurality of programmed states that are determined by its threshold voltage.

In a nonvolatile memory, which has multi-level cells, it is important to narrow the widths of threshold voltage distributions of programmed states, and thereby secure margin between the respective programmed states. Generally, 2-bit data or 3-bit data is stored in the multi-level memory cells of the nonvolatile memory. In this regard, by setting the voltage of an erased state and partial threshold voltages of a plurality of programmed states, to a negative level, the performance and the reliability of the nonvolatile memory having the multi-level cells may be improved.

Meanwhile, the plurality of memory cells included in a block are connected with a plurality of global word lines through a plurality of switches. When the corresponding block is selected, the voltages of the plurality of global word lines are transferred to a plurality of local lines, which are connected with the plurality of memory cells, through a plurality of high voltage switches, and, when the corresponding block is not selected, the voltages of the plurality of global word lines are interrupted by the plurality of high voltage switches. Accordingly, there is demand for high voltage switches that reliably transfer high voltages of global word lines to local lines when a corresponding block is selected, and reliably interrupt the high voltages of global word lines when a corresponding block is not selected, and a control technology thereof.

SUMMARY

Various embodiments are directed to a high voltage switch circuit capable of reliably transferring and interrupting a high voltage. In particular, various embodiments are directed to a high voltage switch circuit capable of reliably operating in a device that uses a low power supply voltage.

In an embodiment, a high voltage switch circuit may include: a high voltage switch suitable for transferring a voltage of an input terminal to an output terminal in response to a voltage of a control node; a first transistor suitable for electrically connecting a first node and the control node in response to an inverted activation signal; a second transistor suitable for supplying a first high voltage to the first node in response to an activation signal; a third transistor connected in parallel to the second transistor, and operable in response to the control node; a discharge transistor suitable for discharging the control node; and a first level shifter suitable for changing a swing level of a preliminary activation signal, and generating the activation signal and the inverted activation signal. The high voltage switch circuit may further include a second level shifter suitable for generating the activation signal and the inverted activation signal by changing a level of a preliminary activation signal.

The first level shifter may generate the activation signal and the inverted activation signal, levels of which fall in a range from the ground voltage to a second high voltage, which is higher than the power supply voltage, and lower than the first high voltage, by changing the level of the preliminary activation signal to a range from a ground voltage to a power supply voltage. Also, the second level shifter may generate the discharge signal, a level of which falls in a range from a negative voltage to the power supply voltage, by changing the level of the preliminary activation signal to the range from the ground voltage to the power supply voltage.

The high voltage switch may include a high voltage NMOS transistor, the first transistor may include a high voltage PMOS transistor, the second transistor may include a depletion high voltage NMOS transistor, the third transistor may include a depletion high voltage NMOS transistor, and the discharge transistor may include a high voltage NMOS transistor.

In an embodiment, a nonvolatile memory may include: a cell block including a plurality of cells; a plurality of global lines; a plurality of high voltage switches suitable for transferring voltages of the plurality of global lines to a plurality of local lines in the cell block in response to a voltage of a control node; a first transistor suitable for electrically connecting a first node and the control node in response to an inverted activation signal; a second transistor suitable for supplying a first high voltage to the first node in response to an activation signal; a third transistor connected in parallel to the second transistor, and operable in response to the control node; a discharge transistor suitable for discharging the control node; and a first level shifter suitable for generating the activation signal and the inverted activation signal by changing a level of a preliminary activation signal.

DETAILED DESCRIPTION

Figure 1:
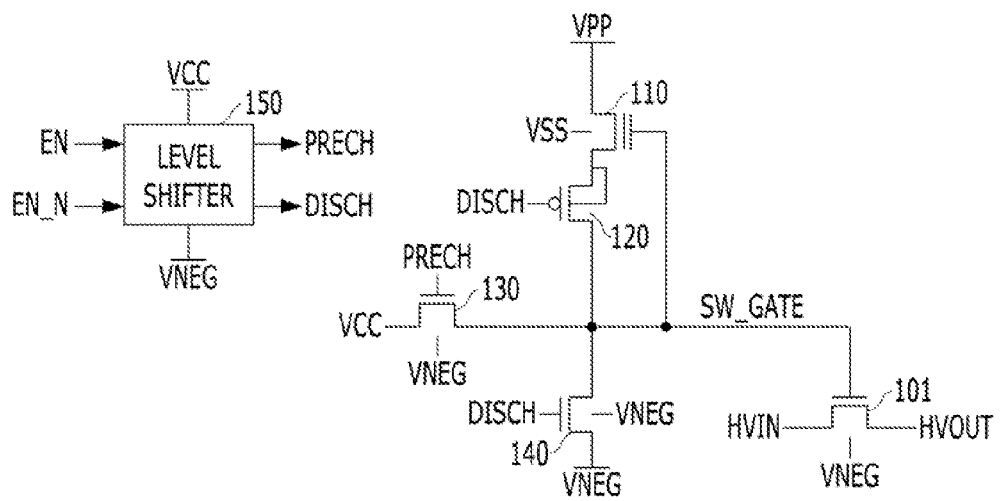
FIG. 1 is a configuration diagram of a high voltage switch circuit in accordance with an embodiment.

Various embodiments will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention.

FIG. 1 is a configuration diagram of a high voltage switch circuit in accordance with an embodiment.

Referring to FIG. 1, the high voltage switch circuit may include a high voltage switch 101, high voltage NMOS transistors 130 and 140, a high voltage PMOS transistor 120, a depletion high voltage NMOS transistor 110, and a level shifter 150.

The high voltage switch 101 may control transmission of a voltage from an input terminal HVIN to an output terminal HVOUT in response to the voltage of a control node SW_GATE. The high voltage switch 101 may be configured by a high voltage NMOS transistor.

The level shifter 150 may shift swing levels of a preliminary activation signal EN and an inverted preliminary activation signal EN_N, and may generate a precharge signal PRECH and a discharge signal DISCH. The preliminary activation signal EN and the inverted preliminary activation signal EN_N may swing from a ground voltage VSS (0V) to the level of a power supply voltage VCC (approximately 1.8V to approximately 2.3V), and the precharge signal PRECH and the discharge signal DISCH may swing from a negative voltage VNEG lower than the ground voltage VSS (approximately −0.1V to approximately −2.0V) to the level of the power supply voltage VCC. The preliminary activation signal EN may turn on or off the high voltage switch 101. When the preliminary activation signal EN is activated, the high voltage switch 101 may be turned on.

Operation of the high voltage switch 101 will be described below with reference to FIG. 1.

Turning on the High Voltage Switch 101

When the preliminary activation signal EN is activated, the level shifter 150 may activate the precharge signal PRECH to the level of the power supply voltage VCC, and may deactivate the discharge signal DISCH to the level of the negative voltage VNEG. As the high voltage NMOS transistor 130 is turned on by the activation of the precharge signal PRECH, the voltage of the control node SW_GATE may be precharged to VCC-Vth (a threshold voltage). Then, the depletion high voltage NMOS transistor 110 may be turned on by a positive feedback, and the high voltage PMOS transistor 120 may be turned on. As a consequence, a high voltage VPP (approximately 10V to approximately 30V) may be transferred to the control node SW_GATE, and the high voltage switch 101 may be turned on.

Turning Off the High Voltage Switch 101

When the preliminary activation signal EN is deactivated, the level shifter 150 may deactivate the precharge signal PRECH to the level of the negative voltage VNEG, and may activate the discharge signal DISCH to the level of the power supply voltage VCC. The high voltage NMOS transistor 140 may be turned on by the activation of the discharge signal DISCH, and the negative voltage VNEG may be transferred to the control node SW_GATE. As a result, the control node SW_GATE may become the level of the negative voltage VNEG, and the high voltage switch 101 may be turned off.

For the high voltage switch circuit configured as shown in FIG. 1 to operate reliably, it should be assumed that the level of the power supply voltage VCC is sufficiently high. If the level of the power supply voltage VCC is too low (for example, approximately to 1.5V or less), in the turn-on operation of the high voltage switch 101, since the precharge level VCC-Vth of the control node SW_GATE becomes too low, it may be difficult for the high voltage VPP to be transferred to the control node SW_GATE by the positive feedback. Also, if the level of the power supply voltage VCC is low, in the turn-off operation of the high voltage switch 101, since the high voltage PMOS transistor 120 is unlikely to be turned off, a situation may occur in which it is difficult for the high voltage switch 101 to be turned off.

The high voltage transistors 101, 120, 130 and 140 may be designed to endure a high voltage. Such transistors may be implemented with a triple well structure. Meanwhile, the depletion high voltage transistor 110 may have a negative threshold voltage. The accompanying drawings show voltages VNEG, VCC and VSS applied to the bulk regions of the transistors.

Figure 2:
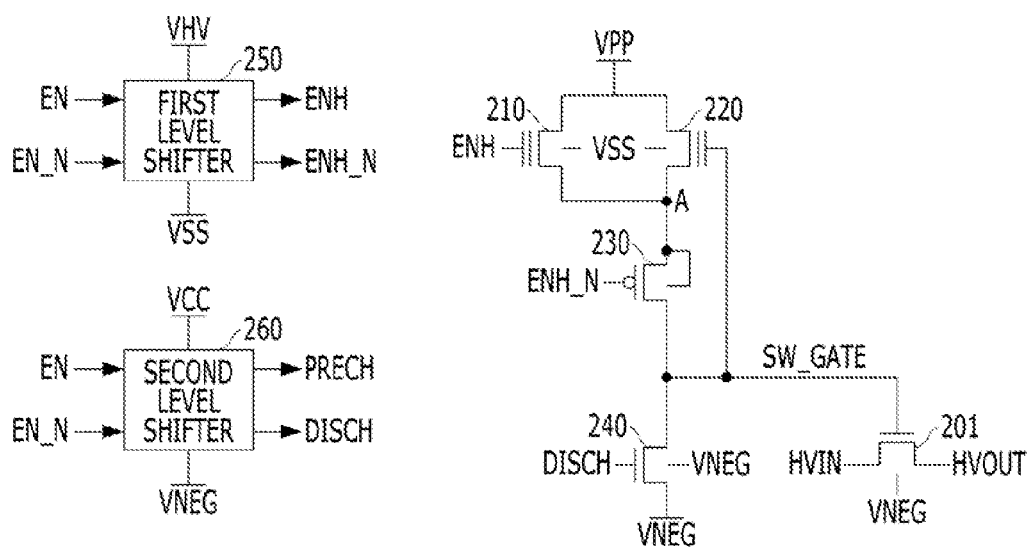
FIG. 2 is a configuration diagram of a high voltage switch circuit in accordance with an exemplary embodiment of the present invention.

FIG. 2 is a configuration diagram of a high voltage switch circuit in accordance with an exemplary embodiment of the present invention.

Referring to FIG. 2, the high voltage switch circuit may include a high voltage switch 201, a first transistor 230, a second transistor 210, a third transistor 220, a discharge transistor 240, a first level shifter 250, and a second level shifter 260.

The high voltage switch 201 may control transmission of a voltage from an input terminal HVIN to an output terminal HVOUT in response to the voltage of a control node SW_GATE. The high voltage switch 201 may be configured by a high voltage NMOS transistor.

The first level shifter 250 may shift swing levels of a preliminary activation signal EN and an inverted preliminary activation signal EN_N, and may generate an activation signal ENH and an inverted activation signal ENH_N. The preliminary activation signal EN and the inverted preliminary activation signal EN_N may swing from a ground voltage VSS (0V) to the level of a power supply voltage VCC (approximately 1.8V to approximately 2.3V), and the activation signal ENH and the inverted activation signal ENH_N may swing from the ground voltage VSS to the level of a second high voltage VHV. When the preliminary activation signal EN is activated, the activation signal ENH may be activated, and, when the preliminary activation signal EN is deactivated, the inverted activation signal ENH_N may be activated. The second high voltage VHV may be higher than the power supply voltage VCC, and lower than a first high voltage VPP (approximately 10V to approximately 30V). For example, the second high voltage VHV may have a voltage level of approximately 4.5V. The preliminary activation signal EN may turn on or off the high voltage switch 201. When the preliminary activation signal EN is activated, the high voltage switch 201 may be turned on.

The second level shifter 260 may change the swing levels of the preliminary activation signal EN and the inverted preliminary activation signal EN_N, and may generate a precharge signal PRECH and a discharge signal DISCH. The preliminary activation signal EN and the inverted preliminary activation signal EN_N may swing from the ground voltage VSS to the level of the power supply voltage VCC, and the precharge signal PRECH and the discharge signal DISCH may swing from a negative voltage VNEG lower than the ground voltage VSS (approximately −0.1V to approximately −2.0V) to the level of the power supply voltage VCC.

The first transistor 230 may electrically connect a first node A and the control node SW_GATE in response to the inverted activation signal ENH_N. The first transistor 230 may be a high voltage PMOS transistor.

The second transistor 210 may supply the first high voltage VPP to the first node A in response to the activation signal ENH. The third transistor 220 may be connected in parallel to the second transistor 210, and may be controlled by the control node SW_GATE. Each of the second transistor 210 and the third transistor 220 may be a depletion high voltage NMOS transistor, which has a negative threshold voltage (Vth).

The discharge transistor 240 may discharge the control node SW_GATE in response to the discharge signal DISCH. The discharge transistor 240 may be a high voltage NMOS transistor.

Operation of the high voltage switch 201 will be described below with reference to FIG. 2.

Turning on the High Voltage Switch 201

When the preliminary activation signal EN is activated, the first level shifter 250 may activate the activation signal ENH to the level of the second high voltage VHV, and may deactivate the inverted activation signal ENH_N to the level of the ground voltage VSS. Further, the second level shifter 260 may deactivate the discharge signal DISCH to the level of the negative voltage VNEG. The second transistor 210 may be turned on by the activation of the activation signal ENH, and the first transistor 230 may be turned on by the deactivation of the inverted activation signal ENH_N. Then, the voltage of the control node SW_GATE may rise to the level of the first high voltage VPP, and therefore, the high voltage switch 201 may be turned on. Meanwhile, as the voltage of the control node SW_GATE serves as a positive feedback, the third transistor 220 may be turned on as well.

Turning Off the High Voltage Switch 201

When the preliminary activation signal EN is deactivated, the first level shifter 250 may deactivate the activation signal ENH to the level of the ground voltage VSS, and may activate the inverted activation signal ENH_N to the level of the second high voltage VHV. Further, the second level shifter 260 may activate the discharge signal DISCH to the level of the power supply voltage VCC. The discharge transistor 240 may be turned on by the activation of the discharge signal DISCH, and the voltage of the control node SW_GATE may fall to the level of the negative voltage VNEG, by which the high voltage switch 201 may be turned off. At this time, the transistors 210, 220 and 230 may be turned off.

In accordance with an exemplary embodiment of the present invention, the power supply voltage VCC may not be involved in turning on and off of the transistors 210, 220 and 230 of the high voltage switch circuit configured as shown in FIG. 2, and therefore the high voltage switch 201 may be reliably turned on and off even though the level of the power supply voltage VCC falls. Also, the control node SW_GATE may rise directly to the level of the first high voltage VPP without precharge of the control node SW_GATE, and therefore the high voltage switch 201 may be quickly turned on without the element, for example, the high voltage NMOS transistors 130 described with reference to FIG. 1 for the precharge of the control node SW_GATE.

Figure 3:
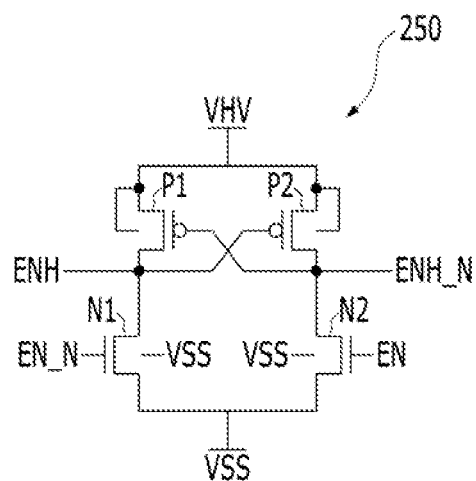
FIG. 3 is a configuration diagram of an example of a first level shifter shown in FIG. 2.

FIG. 3 is a configuration diagram of an example of the first level shifter 250 shown in FIG. 2.

Referring to FIG. 3, the first level shifter 250 may include a first NMOS transistor N1, which pull-down drives the activation signal ENH in response to the inverted preliminary activation signal EN_N, a second NMOS transistor N2, which pull-down drives the inverted activation signal ENH_N in response to the preliminary activation signal EN, a first PMOS transistor P1, which drives the activation signal ENH to the level of the second high voltage VHV in response to the inverted activation signal ENH_N, and a second PMOS transistor P2, which drives the inverted activation signal ENH_N to the level of the second high voltage VHV in response to the activation signal ENH.

Operations of the first level shifter 250 may be simply represented as in the following Table 1.

TABLE 1

| IN | | OUT | |
|---|---|---|---|
| EN | EN_N | ENH | ENH_N |
| VCC | VSS | VHV | VSS |
| VSS | VCC | VSS | VHV |

Figure 4:
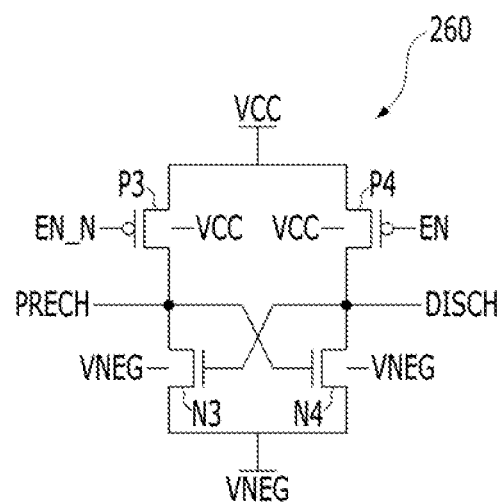
FIG. 4 is a configuration diagram of an example of a second level shifter shown in FIG. 2.

FIG. 4 is a configuration diagram of an example of the second level shifter 260 shown in FIG. 2.

Referring to FIG. 4, the second level shifter 260 may include a third NMOS transistor N3, which drives the precharge signal PRECH to the level of the negative voltage VNEG in response to the discharge signal DISCH, a fourth NMOS transistor N4, which drives the discharge signal DISCH to the level of the negative voltage VNEG in response to the precharge signal PRECH, a third PMOS transistor P3, which pull-up drives the precharge signal PRECH in response to the inverted preliminary activation signal EN_N, and a fourth PMOS transistor P4 which pull-up drives the discharge signal DISCH in response to the preliminary activation signal EN.

Operations of the second level shifter 260 may be simply represented as in the following Table 2.

TABLE 2

| IN | | OUT | |
|---|---|---|---|
| EN | EN_N | PRECH | DISCH |
| VCC | VSS | VCC | VNEG |
| VSS | VCC | VNEG | VCC |

Figure 5:
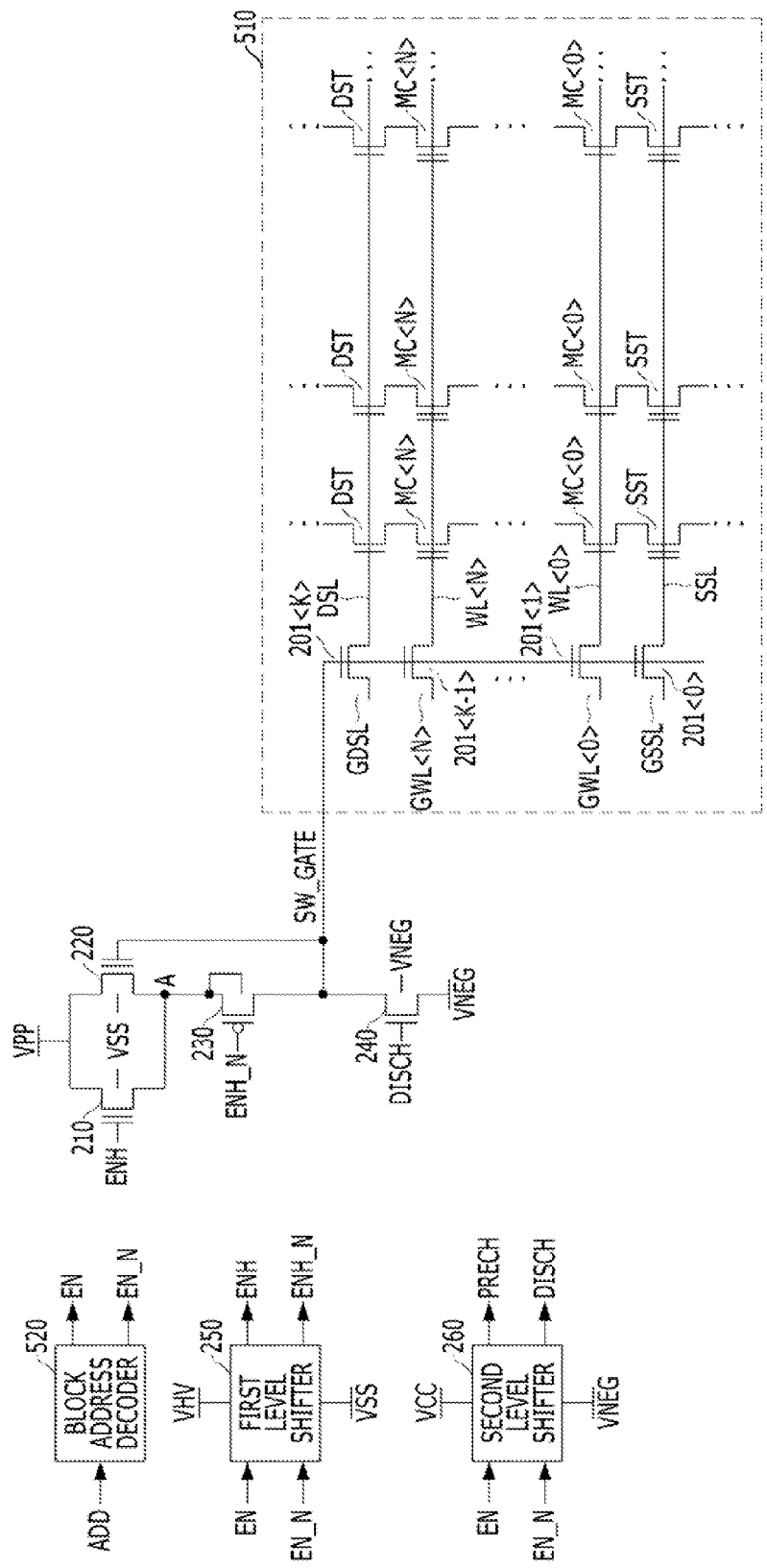
FIG. 5 is a configuration diagram of a nonvolatile memory in accordance with an exemplary embodiment of the present invention.

FIG. 5 is a configuration diagram of a nonvolatile memory in accordance with an exemplary embodiment of the present invention. FIG. 5 shows the nonvolatile memory having the high voltage switch circuit described with reference to FIG. 2 as an example.

Referring to FIG. 5, the nonvolatile memory may include a cell block 510, which includes a plurality of memory cells MC<0:N>, a drain select transistor DST, and a source select transistor SST, a plurality of high voltage switches 201<0:K> for transferring the voltages of a plurality of global lines GWL<0:N>, GDSL and GSSL to a plurality of local lines WL<0:N>, DSL and SSL in the cell block 510, and a block address decoder 520. The nonvolatile memory may further include the high voltage switch circuit described with reference to FIG. 2 for controlling the turn-on and the turn-off of the plurality of high voltage switches 201<0:K>.

The block address decoder 520 may decode an address ADD, and activate a preliminary activation signal EN when the cell block 510 is selected to be accessed, that is, selection is made such that a read or program operation is performed in the cell block 510. When the preliminary activation signal EN is activated, as described above, the voltage level of a control node SW_GATE may become capable of turning on the high voltage switches 201<0:K>. As a consequence, the high voltage switches 201<0:K> may be turned on, and the voltage levels of the global lines GWL<0:N>, GDSL and GSSL may be transferred to the local lines WL<0:N>, DSL and SSL. When the preliminary activation signal EN is deactivated, the high voltage switches 201<0:K> are turned off, and the voltage levels of the global lines GWL<0:N>, GDSL and GSSL may be interrupted so they are not transferred to the local lines WL<0:N>, DSL and SSL.

As is apparent from the above descriptions, according to the embodiments, a high voltage switch circuit may reliably transfer and interrupt a high voltage. As a consequence, the high voltage switch circuit may reliably operate in a device that uses a low power supply voltage.

Although various embodiments have been described for illustrative purposes, it will be apparent to those skilled in the art that various changes and modifications may be made without departing from the spirit and scope of the invention as defined in the following claims.

What is claimed is:

1. A high voltage switch circuit comprising:
   a high voltage switch suitable for transferring a voltage of an input terminal to an output terminal in response to a voltage of a control node;
   a first transistor suitable for electrically connecting a first node and the control node in response to an inverted activation signal;
   a second transistor suitable for supplying a first high voltage to the first node in response to an activation signal;
   a third transistor connected in parallel to the second transistor, and operable in response to the control node;
   a discharge transistor suitable for discharging the control node; and
   a first level shifter suitable for generating the activation signal and the inverted activation signal by changing a level of a preliminary activation signal.

2. The high voltage switch circuit according to claim 1, further comprising a second level shifter suitable for generating a discharge signal, which controls the discharge transistor, by changing the level of the preliminary activation signal.

3. The high voltage switch circuit according to claim 2, wherein the first level shifter generates the activation signal and the inverted activation signal, levels of which fall in a range from the ground voltage to a second high voltage, which is higher than the power supply voltage and lower than the first high voltage, by changing the level of the preliminary activation signal to a range from a ground voltage to a power supply voltage.

4. The high voltage switch circuit according to claim 3, wherein the second level shifter generates the discharge signal, a level of which falls in a range from a negative voltage to the power supply voltage, by changing the level of the preliminary activation signal to the range from the ground voltage to the power supply voltage.

5. The high voltage switch circuit according to claim 1, wherein the high voltage switch comprises a high voltage NMOS transistor,
   wherein the first transistor comprises a high voltage PMOS transistor,
   wherein the second transistor comprises a depletion high voltage NMOS transistor,
   wherein the third transistor comprises a depletion high voltage NMOS transistor, and
   wherein the discharge transistor comprises a high voltage NMOS transistor.

6. The high voltage switch circuit according to claim 4, wherein the first level shifter comprises:
   a first NMOS transistor suitable for pull-down driving the activation signal in response to an inverted preliminary activation signal;
   a second NMOS transistor suitable for pull-down driving the inverted activation signal in response to the preliminary activation signal;
   a first PMOS transistor suitable for driving the activation signal to a level of the second high voltage in response to the inverted activation signal; and
   a second PMOS transistor suitable for driving the inverted activation signal to the level of the second high voltage in response to the activation signal.

7. The high voltage switch circuit according to claim 6, wherein the second level shifter comprises:
   a third NMOS transistor suitable for driving a precharge signal to a level of the negative voltage in response to the discharge signal;
   a fourth NMOS transistor suitable for driving the discharge signal to the level of the negative voltage in response to the precharge signal;
   a third PMOS transistor suitable for pull-up driving the precharge signal in response to the inverted preliminary activation signal; and
   a fourth PMOS transistor suitable for pull-up driving the discharge signal in response to the preliminary activation signal.

8. A nonvolatile memory comprising:
   a cell block including a plurality of cells;
   a plurality of global lines;
   a plurality of high voltage switches suitable for transferring voltages of the plurality of global lines to a plurality of local lines in the cell block in response to a voltage of a control node;
   a first transistor suitable for electrically connecting a first node and the control node in response to an inverted activation signal;
   a second transistor suitable for supplying a first high voltage to the first node in response to an activation signal;
   a third transistor connected in parallel to the second transistor, and operable in response to the control node;
   a discharge transistor suitable for discharging the control node; and
   a first level shifter suitable for generating the activation signal and the inverted activation signal by changing a level of a preliminary activation signal.

9. The nonvolatile memory according to claim 8, wherein the preliminary activation signal is activated when selection is made such that the cell block is accessed.

10. The nonvolatile memory according to claim 8, further comprising a second level shifter suitable for generating a discharge signal, which controls the discharge transistor, by changing the level of the preliminary activation signal.

11. The nonvolatile memory according to claim 10, wherein the first level shifter suitable for generating the activation signal and the inverted activation signal, levels of which fall in a range from the ground voltage to a second high voltage, which is higher than the power supply voltage and lower than the first high voltage, by changing the level of the preliminary activation signal to a range from a ground voltage to a power supply voltage.

12. The nonvolatile memory according to claim 11, wherein the second level shifter suitable for generating the discharge signal, a level of which falls in a range from a negative voltage to the power supply voltage, by changing the level of the preliminary activation signal to the range from the ground voltage to the power supply voltage.

13. The nonvolatile memory according to claim 8,
wherein each of the high voltage switches comprises a high voltage NMOS transistor,
wherein the first transistor comprises a high voltage PMOS transistor,
wherein the second transistor comprises a depletion high voltage NMOS transistor,
wherein the third transistor comprises a depletion high voltage NMOS transistor, and
wherein the discharge transistor comprises a high voltage NMOS transistor.

14. The nonvolatile memory according to claim 12, wherein the first level shifter comprises:
a first NMOS transistor suitable for pull-down driving the activation signal in response to an inverted preliminary activation signal;
a second NMOS transistor suitable for pull-down driving the inverted activation signal in response to the preliminary activation signal;
a first PMOS transistor suitable for driving the activation signal to a level of the second high voltage in response to the inverted activation signal; and
a second PMOS transistor suitable for driving the inverted activation signal to the level of the second high voltage in response to the activation signal.

15. The nonvolatile memory according to claim 14, wherein the second level shifter comprises:
a third NMOS transistor suitable for driving a precharge signal to a level of the negative voltage in response to the discharge signal;
a fourth NMOS transistor suitable for driving the discharge signal to the level of the negative voltage in response to the precharge signal;
a third PMOS transistor suitable for pull-up driving the precharge signal in response to the inverted preliminary activation signal; and
a fourth PMOS transistor suitable for pull-up driving the discharge signal in response to the preliminary activation signal.

* * * * *